United States Patent

Juang et al.

[11] Patent Number: 5,804,493
[45] Date of Patent: Sep. 8, 1998

[54] METHOD FOR PREVENTING SUBSTRATE DAMAGE DURING SEMICONDUCTOR FABRICATION

[75] Inventors: Minn-Horng Juang, Ping-Tung; Cheng-Tsung Ni; Chih-Hsien Wang, both of Hsinchu, all of Taiwan

[73] Assignee: Mosel Vitelic, Inc., Hsin-Chu, Taiwan

[21] Appl. No.: 540,773

[22] Filed: Oct. 11, 1995

[51] Int. Cl.⁶ .................................................. H01L 27/105
[52] U.S. Cl. ........................... 438/440; 440/449; 440/705
[58] Field of Search ............................... 156/628.1, 662.1, 156/657.1; 216/62, 87; 437/69; 438/703, 705, 743, 744, 439, 440, 449

[56] References Cited

U.S. PATENT DOCUMENTS

| | | | |
|---|---|---|---|
| 4,931,405 | 6/1990 | Kamijo et al. | 437/12 |
| 5,244,819 | 9/1993 | Yue | 437/11 |
| 5,279,976 | 1/1994 | Hayden et al. | 437/31 |
| 5,480,828 | 1/1996 | Hsu et al. | 437/56 |

OTHER PUBLICATIONS

"Silicon Processing For the ULSI Era"; vol. 2; Process Integration; Wolf; Lattice Press; Sunset Beach, Ca.; © 1990; pp. 32–35, 199.

"VLSI Fabrication Principles—Silicon and Gallium Arsenide"; Sorat K. Ghandhi; John Wiley & Sons; NY, NY; © 1983; pp. 377–383.

*Primary Examiner*—R. Bruce Breneman
*Assistant Examiner*—George Goudreau
*Attorney, Agent, or Firm*—Baker & Botts, L.L.P.

[57] ABSTRACT

A method for preventing substrate damage during semiconductor fabrication, comprising, forming a pad oxide layer on the substrate, depositing a polysilicon buffer layer on the pad oxide layer, ion-implanting fluorine into the polysilicon buffer layer, depositing a silicon nitride layer on the polysilicon buffer layer, defining an active region in the substrate, forming a local oxide layer beside the surface of the active region, removing the silicon nitride layer, removing the polysilicon buffer layer by dry etching, and etching the pad oxide layer to expose the substrate surface of active region.

17 Claims, 2 Drawing Sheets

METHOD FOR PREVENTING SUBSTRATE DAMAGE DURING SEMICONDUCTOR FABRICATION

FIELD OF THE INVENTION

The present invention relates to a method of semiconductor manufacturing, especially to a process that the property of polysilicon buffer layer is modified by implanting fluorine ions into the polysilicon buffer layer.

BACKGROUND OF THE INVENTION

As device dimensions get smaller, and device density increases, it becomes more and more difficult to build an efficient and reliable isolation process to separate individual active devices. The main drawback with the conventional LOCal Oxidation of Silicon (LOCOS) is the existence of a long "bird's beak" length or oxide encroachment into the active device region of the substrate which limits usable active device area.

Conventionally, the LOCOS technology is suitable for the technology up to 0.5 μm design rule. In the development of 64M DRAM for and beyond technology. Advanced LOCOS technology is required. Polysilicon buffer LOCOS (PBLOCOS) technology has been taken to further suppress the lateral oxidation to meet the demands of the submicron device isolation and further provides a stress buffer layer between oxide layer and nitride layer. However, in standard PBLOCOS processing, the substrate has been found to pit after nitride and polysilicon removal. The pitting becomes more and more serious as the active area dimensions are reduced to the submicron order. This "pitting" phenomenon is discussed in "Poly-void Formation in Poly Buffer LOCOS process" by H. S. Yang, et al.

In the isolation process, after the field oxidation was grown, the nitride and polysilicon layers were removed from the active regions. During the removal process of the polysilicon layer the pitting of the active areas occurs due to exposure of the substrate to the etchant that is used for removing the polysilicon layer. As a result, the exposed surface of the substrate becomes "pitted" by the etchant.

Therefore, aggressive improvement in isolation is limited due to the pitting problem.

SUMMARY OF THE INVENTION

The purpose of the present invention to eliminate the disadvantages of the semiconductor device produced by the conventional PBLOCOS processing technology. The serious defect is the pits that damage the active region of the device. The main object of the present invention is to avoid the formation of the pits. In comparison with the conventional PBLOCOS technology, the feature of the present invention is that the property of polysilicon is modified by implanting fluorine into polysilicon. Then, a more perfect active region of the device could be achieved.

The object of the present invention is fulfilled by providing a method for preventing substrate damage during semiconductor device fabrication. The method comprises the following steps: forming a pad oxide layer on the substrate, depositing a polysilicon buffer layer on the pad oxide layer, ion-implanting fluorine into the polysilicon buffer layer, depositing a silicon nitride layer on the polysilicon buffer layer, defining an active region in the substrate, forming a local oxide layer beside surface of the active region, removing the silicon nitride layer, removing the polysilicon buffer layer by dry etching, and etching the pad oxide layer to expose substrate surface of the active region.

BRIEF DESCRIPTION OF THE DRAWING

The present invention will be more fully understood from the detailed description given hereinafter with reference to and the accompanying drawings which are given by way of illustration only, and thus are not limitative of the present invention and wherein.

DETAILED DESCRIPTION OF THE PREFERRED EMBODIMENT

In order to avoid the possible pits formation problem generated by the implementation of conventional PBLOCOS processing technology, an embodiment of the present invention is applied to a semiconductor substrate according to the present invention as illustrated in FIGS. 1 to 8 and as described hereinafter.

Figure 1:
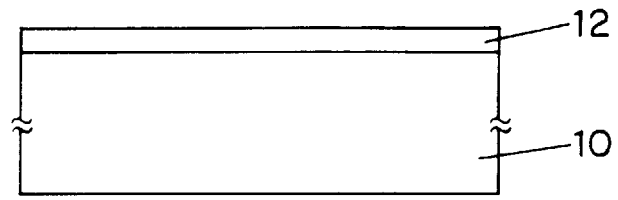
FIGS. 1 to 8 show cross-sectional views of the semiconductor device that is manufactured according to the present invention.

Referring to FIG. 1, a pad oxide layer 12 is formed on a silicon substrate 10. The thickness of the pad oxide layer 12 is in a preferably approximate range of 60~200 angstroms.

Figure 2:
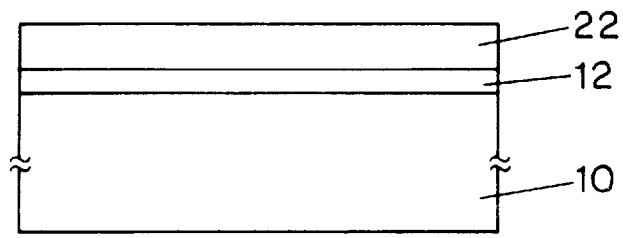

Next, referring to FIG. 2, a polysilicon layer 22 is deposited on the pad oxide layer 12. The polysilicon layer 22 is used as a buffer layer, and its thickness is in a preferably approximate range of 500~600 angstroms.

Figure 3:
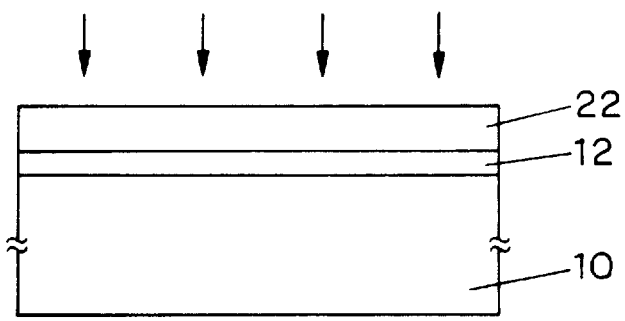

Referring to FIG. 3, the fluorine ions are implanted into the polysilicon layer 22. The ion implantation of fluorine ions has a dosage preferably in the range of 2E15 to 7E15 ions/cm2 and an implant energy in the approximate range of 20 Kev. The purpose of the fluorine ions implantation is to adjust the property of polysilicon layer 22 used in the conventional PBLOCOS process. By implanting the fluorine ions, the microcrystalline structure of polysilicon is changed, so as to minimize the polysilicon grains and enable the polysilicon layer 22 to absorb greater stress. Besides, it is more oxidation resistant to inhibit the formation of oxy-nitride that affects the removal of polysilicon.

Figure 4:
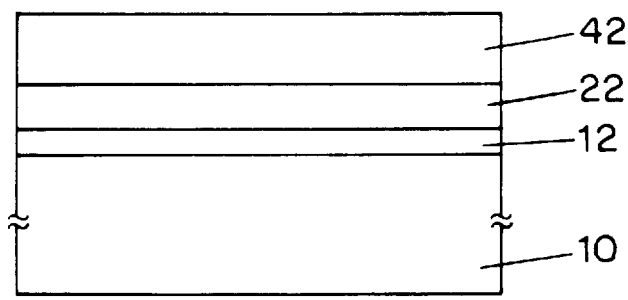

Subsequently, as shown in FIG. 4. a silicon nitride layer 42 is deposited on the polysilicon layer 22, and its thickness is in a preferably approximate range of 1500~2000 angstroms.

Figure 5:
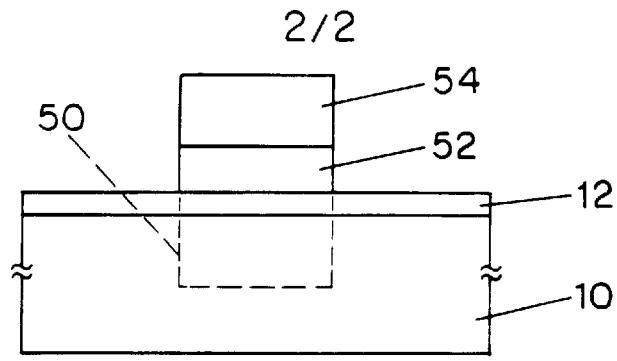

Referring to FIG. 5, the following step is to coat photo resist (not shown) to define active region 50 of the device. Then, after developing the photo resist, the silicon nitride layer 42 and polysilicon layer 22 are anisotropically etched to form 52, 54 as depicted in the Figure.

Figure 6:
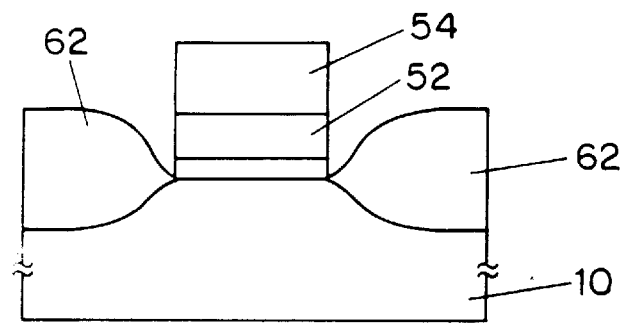

Subsequently, as shown in FIG. 6, the next step is to form a field oxide layer 62 on the substrate 10. The field oxide layer 62 has a thickness preferably in the range of 4500~6000 angstroms, and could be formed by using a wet oxidation process for 60~100 minutes, while the temperature is about 1000° C.

Figure 7:
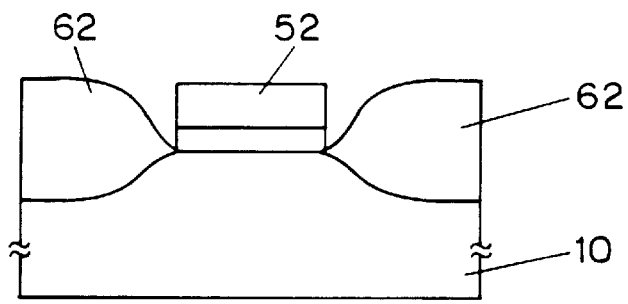

Next, as shown in FIG. 7, silicon nitride layer 54 (not shown) is removed by using phosphorus acid stripping solution.

Figure 8:
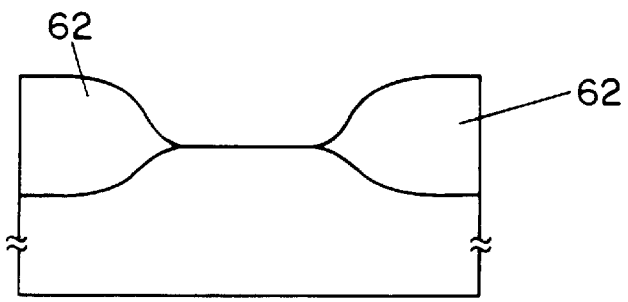

Finally, as shown in FIG. 8, the next step is to remove the polysilicon layer 52 ( not shown). This could be accomplished by using a dry etching process. Then, a subsequent step is to etch the pad oxide layer( not shown) to expose the silicon substrate surface of the active region.

Fig. 8 shows the resulting structure after the polysilicon layer 52 and the pad oxide layer are removed. It has been testified by the results of the inventor's experiments that there is no more pit found on the silicon substrate surface of the active region.

As stated beforehand, it could be concluded that the key feature in the present invention is the fluorine ions implantation. By utilizing this process, the defect generated by using the conventional PBLOCOS process, i.e. pits' formation damage the active region of the semiconductor device, could be eliminated. Therefore, a more perfect active region of the device could be accomplished.

While the invention has been described by way of examples and in terms of several preferred embodiments, it is to be understood that the invention need not be limited to the disclosed embodiment. On the contrary, it is intended to cover various modifications and similar arrangements included within the spirit and scope of the appended claims, the scope of which should be accorded the broadest interpretation so as to encompass all such modifications and similar structures.

What is claimed is:

1. A method for preventing substrate pitting during semiconductor fabrication, comprising:

(i) forming a pad oxide layer over a substrate;

(ii) forming a polysilicon buffer layer on said pad oxide layer;

(iii) performing an ion-implantation with fluorine into said polysilicon buffer layer, for minimizing polysilicon grains of said polysilicon bufferlayer, enabling said polysilicon buffer layer to absorb stress;

(iv) forming a silicon nitride layer on said polysilicon buffer layer;

(v) patterning a photoresist to define an active region in said substrate; and (vi) forming a local oxide region on the region uncovered by said photoresist.

2. The method of claim 1, further comprising the steps removing said polysilicon buffer layer by dry etching said polysilicon buffer layer; and etching said pad oxide layer to expose the surface of said active region.

3. The method of claim 1, wherein said pad oxide layer is in the range of 60~120 angstroms.

4. The method of claim 1, wherein said polysilicon buffer layer is in the range of 500~600 angstroms.

5. The method of claim 1, wherein said silicon nitride layer is in the range of 1500~2000 angstroms.

6. The method of claim 1, wherein said local oxide region is formed by wet oxidation for 60~100 minutes at the temperature of 1000° C.

7. The method of claim 1 wherein, said local oxide region is in the range of 4500~6000 angstroms.

8. The method of claim 1, wherein said implanting energy of said ion-implanting fluorine is in the range of 20 Kev, and the implanting dosage of said ion-implanting fluorine is in the range of 2E15 to 7E15 ions/cm$^2$.

9. The method of claim 1, wherein said silicon nitride layer is removed by using hot phosphorus acid stripping solution.

10. A method for preventing substrate pitting during semiconductor fabrication, comprising:

forming a pad oxide layer over a substrate;

forming a polysilicon buffer layer on said pad oxide layer;

performing an ion-implantation with fluorine into said polysilicon buffer layer, for minimizing polysilicon grains of said polysilicon buffer layer, enabling said polysilicon buffer layer to absorb stress;

forming a silicon nitride layer on said polysilicon buffer layer;

patterning a photoresist to define an active region in said substrate;

forming a local oxide region on the region uncovered by said photoresist;

removing said silicon nitride layer;

removing said polysilicon buffer layer by dry etching said polysilicon buffer layer; and etching said pad oxide layer to expose the surface of said active region.

11. The method of claim 10, wherein said pad oxide layer is in the range of 60~120 angstroms.

12. The method of claim 10, wherein said polysilicon buffer layer is in the range of 500~600 angstroms.

13. The method of claim 10, wherein said silicon nitride layer is in the range of 1500~2000 angstroms.

14. The method of claim 10, wherein said local oxide region is formed by wet oxidation for 60~100 minutes and at the temperature of 1000° C.

15. The method of claim 10, wherein said local oxide layer is in the range of 4500~6000 angstroms.

16. The method of claim 10, wherein said implanting energy of said ion-implanting fluorine is in the range of 20 Kev, and the implanting dosage of said ion-implanting fluorine is in the range of 2E15 to 7E15 ions/cm$^2$.

17. The method of claim 10, wherein said silicon nitride layer is removed by using hot phosphorus acid stripping solution.

* * * * *